United States Patent [19]

Iversen

[11] Patent Number: 4,873,613

[45] Date of Patent: Oct. 10, 1989

[54] COMPACT HIGH POWER MODULAR RF SEMI-CONDUCTOR SYSTEMS PACKAGING

[76] Inventor: Arthur H. Iversen, 15315 Sobey Rd., Saratoga, Calif. 95070

[21] Appl. No.: 276,025

[22] Filed: Nov. 25, 1988

[51] Int. Cl.[4] .............................................. H05K 7/20
[52] U.S. Cl. .................................. 361/385; 165/80.4; 330/66; 357/82
[58] Field of Search .................. 330/65, 66; 333/22 F; 165/104.33, 80.4; 357/82; 361/382, 385, 386

[56] References Cited

U.S. PATENT DOCUMENTS

| | | | |
|---|---|---|---|
| 4,712,609 | 12/1987 | Iverson | 361/385 |
| 4,724,901 | 2/1988 | Munekawa | 357/82 |
| 4,774,630 | 9/1988 | Reisman | 357/82 |

Primary Examiner—Gerald P. Tolin
Attorney, Agent, or Firm—Foley & Lardner

[57] ABSTRACT

There is disclosed a compact high power modular RF Semi-Conductor systems package suitable for constructing RF sources of high power and compact size comprising a liquid coolant conduit incorporating side-by-side input and discharge conduits, said conduit attached at one end to a master coolant conduit; liquid cooled microwave semi-conductor device modules comprising input and output liquid coolant connectors at one end and RF output coupling means at the other end, said modules being mounted on two opposing surfaces of said liquid conduit there being multiple adjacent modules in close proximity to each other on each side, and along the length of said conduit, each module having input and discharge liquid couplers fastened respectively to corresponding input and discharge conduits of said conduit, there being RF coupling means mounted on the opposing ends of said module from said coolant connectors, said RF coupling means joining adjacent modules in such manner that the sum of the RF power output of all modules on each side of said conduit transmitted through successive couplers is additive and is substantially equal to the power delivered from the last coupler into an output wave guide or other RF transmission means;

and, there being a number of RF subsystems set side by side, each having a coolant conduit coupled to said master coolant conduit, and, each module mounted on said coolant conduit having RF coupling means mounted on the opposing surface of said module, said RF coupling means additively joining adjacent modules and thence delivering the summed RF power into said output waveguide.

1 Claim, 1 Drawing Sheet

U.S. Patent  Oct. 10, 1989  4,873,613
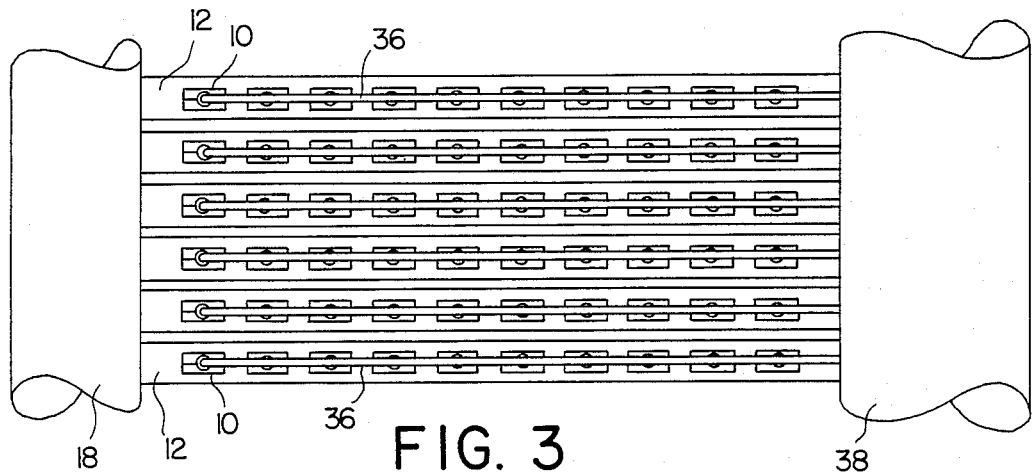
FIG. 3
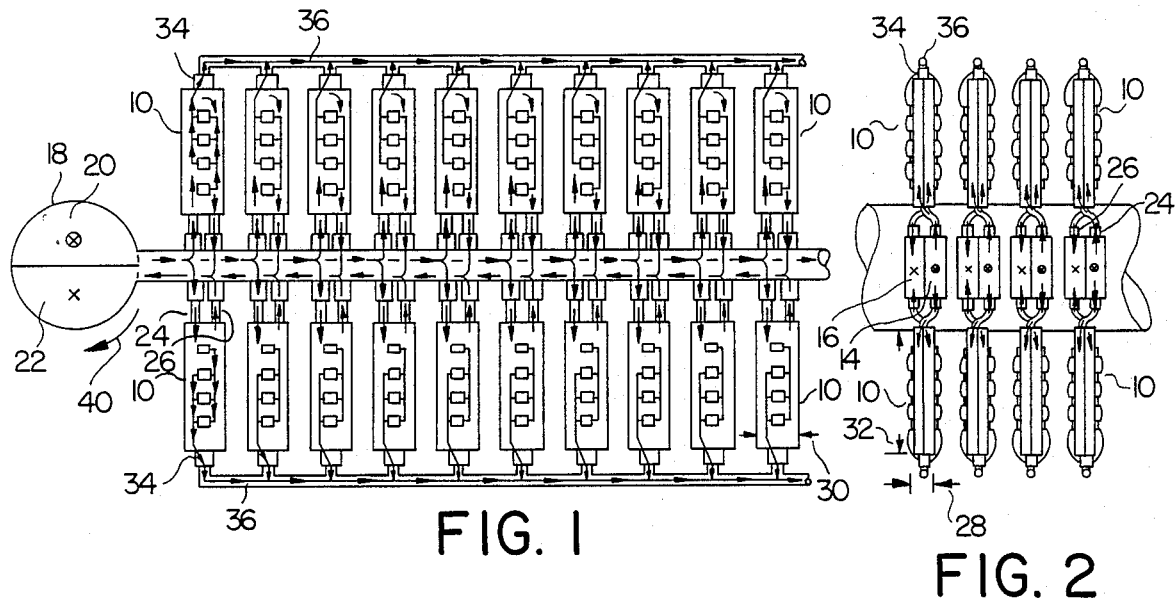
FIG. 1
FIG. 2
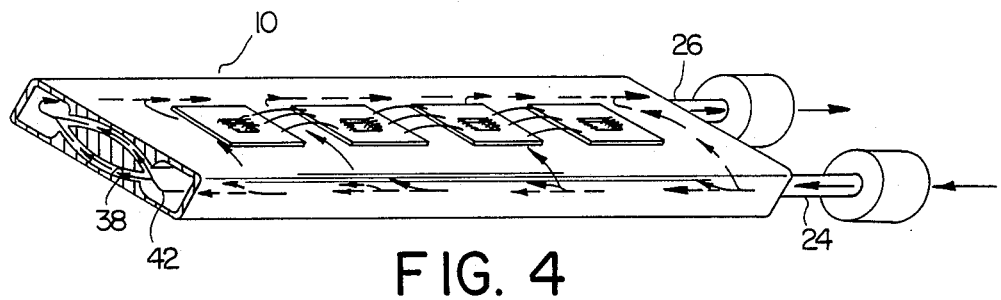
FIG. 4

COMPACT HIGH POWER MODULAR RF SEMI-CONDUCTOR SYSTEMS PACKAGING

TECHNICAL FIELD

The present invention relates to the packaging of high power microwave semi-conductor device subsystems and more specifically to the compact packaging of modular liquid cooled solid state microwave subsystems.

BACKGROUND OF THE INVENTION

There are a number of field and space applications where the need exists for a modular high power RF semi-conductor system. Modular construction permits ready replacement of failed components and compact construction provides economics of space and weight.

SUMMARY OF THE INVENTION

It is an object of the present invention to provide for the large scale packaging of liquid cooled high power solid state microwave devices.

It is yet another object of the present invention to provide for the dense packaging of high power solid state microwave devices.

It is a further object of the present invention to provide for the efficient microwave coupling of a compact array of solid state microwave devices.

It is yet a further object of the present invention to provide for the liquid cooling of a compact array of solid state microwave devices.

DESCRIPTION OF THE DRAWINGS

FIG. 1 is a cross section view of a microwave semi-conductor module assembly.

FIG. 2 is an end view of side-by-side multiple semi-conductor module assemblies.

FIG. 3 is a top view of side-by-side multiple semi-conductor module asemblies.

FIG. 4 is a isometric view of a microwave semi-conductor module.

DESCRIPTION OF THE PREFERRED EMBODIMENT

Referring now to FIGS. 1 and 2, shown are liquid cooled semi-conductor modules 10 attached to opposing sides of coolant conduit 12, said conduit providing separate channels for conduit input 14 and discharge 16. The conduit 12 is attached to main coolant conduit 18 which also provides input 20 and discharge 22 coolant channels.

Semi-conductor modules 10 are attached to conduit 12 by input 24 and discharge 26 coolant tubing and fittings. Typical modules may be ¼ inch thick (28)×1 inch wide (30)3 inches long (32) to accommodate, for example, one RF driver and 3 output chips on each surface as shown in FIGS. 1 and 2. spacing between modules 10 along conduit 12 may be kept small and is principally restricted by working space required to insert and remove modules. Output RF couplers 34 from each module 10 feed medium power RF combiner 36, the various RF combiners 36 in turn feeding into output wave guide 38 (FIG. 3). The short distance between RF couplers 34 along combiner 36 is beneficial from a phase matching and RF loss viewpoint.

Conduit 12 and associated modules 10 are replicated along main coolant conduit 18 forming an array as seen in FIGS. 2 and 3. Spacing between conduits 12 may be kept small and is principally determined by the need to rotate 40 or maneuver a particular conduit out of the array for module replacement Rotation or maneuvering may, for example, be accomplished by a union included in main conduit 18, or a bellows connecting conduit 12 to main conduit 18 may be used. What has been described is a two-dimensional (x and y axis) array of modules 10 with a coolant conduit between and RF power combiner 36 along the periphery, and a main coolant conduit 18 at one end and RF output wave guide 38 at the other end. This two-dimensional array is then extended in the Z direction with multiple conduit 12 and module 10 structures as seen in FIGS. 2 and 3 thereby forming a compact three-dimensional array of semi-conductor RF or computer modules. Each conduit 12 and module 10 attached to main cooling conduit 18 and output wave guide 38 respectively. Assuming approximately 1½ inches between module along conduit 12, ½ inch between conduits 12 and allowing 8 inches for the height of two modules 10 and conduit 12 over 500 modules per cubic foot are obtained (not counting RF power combiners). At 1 KW per module, powers approaching 0.5 MW/ft$^3$ are possible with regard to coolant and module packaging.

When pumping coolant through hundreds to thousands of modules 10 as contemplated for applicatons requiring hundreds of kilowatts to megawatts of power, coolant pumps and associated components constitute a significant share of weight and space requirements, especially if high heat fluxes must be removed from semi-conductor chips. To enable the efficient removal of heat and at the same time reduce pump weight requirements, the teachings of U.S. Pat. No. 4,712,609 may be used as shown in FIG. 4. Modules 10, designed in accordance with said patent, (FIG. 4) is provided with internal curved heat exchange surface 38 as described in said U.S. Patent to efficiently remove nucleate bubbles thereby enhancing heat transfer. Substantial reductions in pump weight and associated components can be expected when considering high heat fluxes as would be desired with high power RF chips.

I claim:

1. A compact microwave solid state subsystem comprising a liquid coolant conduit incorporating side-by-side input and discharge conduits, said conduit attached at one end to a master coolant conduit; liquid cooled microwave semi-conductor device modules comprising input and output liquid coolant connectors at one end and RF output coupling means at the other end, said modules being mounted on two opposing surfaces of said liquid conduit there being multiple adjacent modules in close proximity to each other on each side, and along the length of said conduit, each module having input and discharge liquid couplers fastened respectively to corresponding input and discharge conduits of said conduit, there being RF coupling means mounted on the opposing ends of said module from said coolant connectors, said RF coupling means joining adjacent modules in such manner that the sum of the RF power output of all modules on each side of said conduit transmitted through successive couplers is additive and is substantially equal to the power delivered from the last coupler into an output wave guide;

and, there being a number of RF subsystems set side by side, each having a coolant conduit coupled to said master coolant conduit, and, each module mounted on said coolant conduit having RF coupling means mounted on the opposing surface of said module, said RF coupling means additively joining adjacent modules and thence delivering the summed RF power into said output waveguide.

* * * * *